(12) United States Patent
Moser

(10) Patent No.: US 7,238,631 B2
(45) Date of Patent: Jul. 3, 2007

(54) COMPOSITE MATERIAL COMPRISING TITANIUM DIOXIDE LAYER ON TITANIUM SUBOXIDE LAYER ON SUBSTRATE

(75) Inventor: Eva Marie Moser, Löhningen (CH)

(73) Assignee: Incoat GmbH, Ruschlikon (CH)

( * ) Notice: Subject to any disclaimer, the term of this patent is extended or adjusted under 35 U.S.C. 154(b) by 0 days.

(21) Appl. No.: 10/529,775

(22) PCT Filed: Sep. 30, 2003

(86) PCT No.: PCT/CH03/00653

§ 371 (c)(1), (2), (4) Date: Mar. 30, 2005

(87) PCT Pub. No.: WO2004/029323

PCT Pub. Date: Apr. 8, 2004

(65) Prior Publication Data

US 2006/0006382 A1    Jan. 12, 2006

(30) Foreign Application Priority Data

Sep. 30, 2002  (CH) .................... 1630/02

(51) Int. Cl.
*B32B 33/00*  (2006.01)
(52) U.S. Cl. ...................... 442/136; 442/302
(58) Field of Classification Search ............... 442/136, 442/301, 302
See application file for complete search history.

(56) References Cited

U.S. PATENT DOCUMENTS 3,766,065 A * 10/1973 Chay et al. ............... 252/610
6,326,670 B1 * 12/2001 Nishiyama et al. ......... 257/411
2002/0008914 A1 * 1/2002 Tatsumi ..................... 359/584
2002/0108649 A1 * 8/2002 Fujimori et al. ............ 136/263
2002/0172938 A1 * 11/2002 Cuomo et al. ................ 435/5

* cited by examiner

*Primary Examiner*—Sara Crane
*Assistant Examiner*—Andrew O. Arena
(74) *Attorney, Agent, or Firm*—Notaro & Michalos P.C

(57) ABSTRACT

Composite material (10) comprises a substrate (1) and a chemically, mechanically, physically, catalytically and/or optically functional titanium oxide layer (2), applied on at least one side thereof. A titanium oxide layer (2) is deposited on the substrate (1) as a base layer (3), made from $TiO_x$ with an oxygen content of $0.7 \leq x < 2$, or made from $TiO_x(OH)_y$, with an oxygen content of $0.5 \leq x < 2$ and a hydroxide content of $0 \leq y < 0.7$ and an upper layer (4) of amorphous and/or crystalline $TiO_2$ applied to said base layer (3). In a first method variation, firstly a base layer (3) of $TiO_x$ with an oxygen content of $0.7 \leq x < 2$ is reactively or non-reactively deposited, then, through an increase in the oxygen content, the process pressure, the capacity and/or the substrate temperature, an upper layer (4) of amorphous and/or crystalline $TiO_2$ is deposited. In a second method variation, firstly a base layer (3) of $TiO_x$ with an oxygen content of $0.7 \leq x < 2$ is reactively or non-reactively deposited and then post-oxidized on the surface by means of an electrochemical, thermal and/or plasma process, until the base layer (3) is converted into amorphous or crystalline $TiO_2$ at least partly in an upper layer (4).

21 Claims, 1 Drawing Sheet

Figure 1:
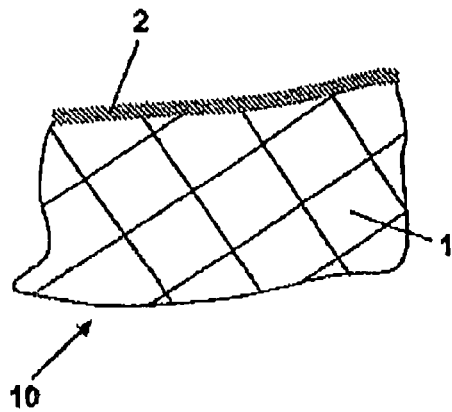

COMPOSITE MATERIAL COMPRISING TITANIUM DIOXIDE LAYER ON TITANIUM SUBOXIDE LAYER ON SUBSTRATE

The invention relates to a composite material of a substrate with, applied to at least one side, a titanium oxide layer with a chemical, physical, mechanical, catalytic and/or optical function. The invention further relates to a process for the production and uses of the composite material.

The broad term substrate comprises firstly easily flammable and/or heat-sensitive materials of polymers, polymer-like or natural materials, but also materials of metal, glass, ceramic and combinations thereof (composites), for which a coating process at low temperatures is preferred for process technical reasons. The substrates are coated with ceramic titanium oxide layers which fulfil one or more protective effects and for example thus increase safety in everyday dealings with highly flammable and/or easily contaminated materials.

The burning behaviour of materials (in particular textiles, films and plastic containers) and the assessment of their fire risk is of great importance as they are always present in the human environment. Textiles are used for example in a multiplicity of applications mainly as clothing, domestic textiles and technical textiles. The combustion process is initiated by way of heating, decomposition and combustion of the flammable material. Depending on its composition, under the effect of heat the material will first melt, flow or remain unchanged, and on further supply of energy will finally decompose and hence develop heat. After ignition of the flammable material the flames are propagated by way of its decomposed surface, where the speed of flame propagation is accompanied by heat emission from the material. As well as combustibility therefore flame propagation and the degree of heat emission are parameters which determine fire.

The required flame protection can be achieved traditionally in various ways. Firstly intrinsically flame-protected polymers can be used such as polyvinyl chloride (PVC) or fluoropolymers. Combustible polymers such as polyethylene (PE), polypropylene (PP) or polyamide (PA) can be given various flame-inhibiting additives (e.g. aluminium hydroxide, magnesium hydroxide, organic bromine compounds). Usually however a high proportion of these additives in the polymer matrix is required to achieve adequate flame protection. This is expressed in a high density, loss of flexibility and low mechanical properties of the material.

Titanium dioxide ($TiO_2$) has known properties as a photo-semiconductor, a high refractive index, a high transparency in the visible and near-infrared wavelength range, a high dielectric constant, gives very good wear protection, is chemically inert and finally has excellent thermal properties. $TiO_2$ crystallises in three modifications: tetragonal rutile, anatase and orthorhombic brookite. Special experimental conditions are required to be able to produce brookite. Rutile is interesting for optical applications while the photo-catalytic properties of anatase are more pronounced due to the optical band gap at 3.2 eV.

There are numerous sub-oxides of titanium ($TiO_x$) with an oxygen content of $0.7 \leq x < 2$. $TiO_x$ with an oxygen content of $0.7 < x < 1.5$ at room temperature has an electrical resistance of around 400 $\mu\Omega cm$, at a higher oxygen content this increases rapidly, and $TiO_2$ is an insulator.

It is known that with $TiO_2$ layers, the crystallinity and its modifications depend on the production method, process parameters and coating configuration. Usually crystalline $TiO_2$ layers are produced with sol-gel processes, spray pyrolysis, painting, electron beam vaporisation on metal-organic chemical vapour deposition (MOCVD) above 300° C. $TiO_2$ layers which are produced with reactive vaporisation or plasma-activated chemical vapour deposition methods (PACVD) below 300° C. are usually amorphous and less dense. If these amorphous layers are tempered between 300° and 500° C., the anatase structure of $TiO_2$ is dominant; on heat treatment above 600° C., the $TiO_2$ modification rutile forms.

Secondly, amorphous or crystalline $TiO_x$ or $TiO_2$ layers can be generated below 300° C. with methods which are characterised by a higher particle energy—e.g. reactive or non-reactive magnetron sputtering (cathode sputtering), non-filtered or filtered spark discharge, ion-beam-assisted deposition (IAD) and pulsed laser deposition. With RF sputtering, depending on the choice of coating parameters, $TiO_2$ can be deposited amorphous or crystalline on an unheated material. In SURFACE AND COATINGS TECHNOLOGY 102 (1998), 67-72, thin titanium dioxide layers are described which are deposited by RF sputtering in an argon-oxygen atmosphere. The microstructures of the $TiO_2$ deposition vary within a broad range from compact to porous and columnar. The O/Ti ratio rises as the pressure increases when the other reaction parameters remain unchanged. The publication deals primarily with scientific experiments.

The invention is based on the object of creating a composite material and a process for its production with a functional titanium oxide layer of the type cited initially which brings improved, in particular synergetic functionalities for a wide range of substrates. An interaction of oxygen and other reactive gases with the substrate should be prevented and said substrate isolated thermally.

With relation to the composite material, the object according to the invention is achieved in that on the substrate is deposited a titanium oxide layer of a base layer of $TiO_x$ with an oxygen content of $0.7 \leq x < 2$ or $TiO_x(OH)_y$ with an oxygen content of $0.5 \leq x < 2$ and a hydroxide content of $0 \leq y < 0.5$ and on this base layer is applied a top layer of amorphous and/or crystalline $TiO_2$. Special and refined embodiments of the composite material are the subject of dependent claims.

The substrate with a base layer and a top layer, where applicable also with further layers, is referred to here and in general for the sake of simplicity as a composite material. Furthermore to avoid repetition, the term $TiO_x$ also always includes the variants $TiO_x(OH)_y$. The terms $TiO_x$, $TiO_x(OH)_y$ and $TiO_2$ comprise pure titanium oxide layers but also titanium oxide layers with other metal oxides where the base layer as a whole contains less than 50 w. %, the top layer is as a whole less than 7 w. % of other metal oxides listed in detail below.

The titanium oxide layer according to the invention is a multi-functional layer which protects a substrate e.g. from combustion, contamination, degradation (migration of additives, photo-oxidization). This allows any material to be given flame protection, a hygienic protection (self-cleaning, germicidal effect), anti-static protection and/or an anti-fogging effect. Such a composite material is suitable for example for use in the medical sector, for household accessories, domestic articles, textiles, carpets, cables and photovoltaics, and in cleaning plants for water, watery solutions and air.

Suitable materials to be protected are in particular highly flammable and/or heat-sensitive materials such as polymers, low melting metals, composites and natural substances in the form of rigid to flexible films, fabrics, membranes, fibres, tubes, plates, containers and powders.

The titanium oxide layer preferably has a total layer thickness of 3 to 1000 nm, where the top layer comprises at least around 10% of the total layer thickness. The top layer comprises titanium dioxide, $TiO_2$, in practice however the transition is flowing and a value of $TiO_{1.99}$ for example can be allocated to the top layer. Furthermore in practice ultra-thin layers of just 3 nm occur rather rarely, suitably the entire layer thickness is in the range of 10 to 300 nm, in particular 20 to 150 nm, where 10 to 50% of the entire layer thickness consists of the top layer.

On use of substrates of plastic and natural substances (in particular wool and cotton), a titanium dioxide layer can be problematical, it can also as a catalyst triggering a decomposition of the substrate surface. With plastics and natural substances it may be suitable, before application of the base layer of $TiO_x$, to apply a protective layer of at least one metal oxide of the group which preferably comprises MgO, ZnO, $ZrO_2$, $In_2O_3$, $Sb_2O_3$, $Al_2O_3$ and $SiO_2$, and/or a polar adhesion layer as an adhesion-promotion layer. The choice of optimum metal oxide or optimum mixture of metal oxides can easily be determined by the specialist by experiment. For a base layer of $TiO_x$ with an oxygen content $x<1.9$ and/or a significant hydroxide content of $0.2<y<0.7$, there is usually no danger for the substrate.

In a further variant of the titanium oxide layer, between the base layer and the top layer can be deposited an electrically conductive intermediate layer which preferably comprises $TiO_x$ with an oxygen content of $0.5 \leq x<1.5$. The electrical conductivity diminishes above an oxygen content of $x \geq 1.5$. The layer can no longer be regarded as electrically conductive, a top layer of $TiO_2$ with an oxygen content of $x=2$ is an insulator. Clearly, an electrically conductive intermediate layer can be deposited in particular when the oxygen content of the base layer lies above $x=1.5$ and if an anti-static effect is to be achieved.

As will be explained in more detail later, at least the top nine atomic layers of the top layer mainly comprise the crystalline $TiO_x$ modification anatase, which corresponds to a layer thickness of around 3 nm.

When the multi-functional titanium oxide layer is used as a flame protection layer of a plastic substrate, sub-micron filler particles of a metal oxide can be added, for example $TiO_x$ and/or $Sb_2O_3$, or a metal hydroxide which dehydrates under heat, for example $Al(OH)_3$ and/or $Sb(OH)_3$. In this case the $TiO_x$ base layer suitably has an oxygen content of $1.5 \leq x \leq 1.9$.

In relation to the process for deposition on a substrate of a titanium oxide layer with a chemical, physical, mechanical, catalytic and/or optical function, the object according to the invention is achieved in a first variant in that first is deposited a reactive base layer of $TiO_x$ with an oxygen content of $0.7 \leq x<2$, then by increasing the oxygen content, process pressure, power and/or substrate temperature a top layer of an amorphous or crystalline $TiO_2$ is deposited.

In the second variant the object is achieved in relation to the process for depositing on a substrate a titanium oxide layer with a chemical, physical, mechanical, catalytic and/or optical function in that first reactively or non-reactively a base layer is deposited of $TiO_x$ with an oxygen content of $0.7 \leq x<2$ and then electrochemically, thermally and/or with a plasma process the surface is post-oxidized until the base layer is restructured at least partly into a top layer of amorphous or crystalline $TiO_2$.

After both processes a top layer of $TiO_2$ is produced. The process parameters are set so that the top layer usually constitutes at least 10% of the total layer thickness. For extremely thin layers according to the second variant the entire base layer can be restructured into a $TiO_2$ layer, but this is not usually the case.

The application takes place with the methods which are known in themselves and already mentioned above, for process technical reasons coating processes at low temperatures are preferred. Any intermediate layer between the base and cover layer and a protective layer between the substrate and the base layer are also deposited using one of the said methods.

Preferably, in particular with a plastic substrate or non-polar material, the base layer or protective layer is applied after plasma activation of the substrate surface. This increases the adhesion of the layer to be deposited. Pretreatment can also take place by means of an ultra-thin polar plasma layer of a few nanometers thickness. This polar plasma layer firstly increases the adhesion of the base layer and secondly prevents degradation of the substrate. For the generation of a polar layer with long-term stability, reference is made to WO 99/39842, according to which for polar coating a water-free process gas is used which contains at least one also substituted hydrocarbon compound with up to 8 C/atoms and an inorganic gas.

The ceramic coating can take place directly after the surface treatment of the substrate or later.

In a refinement of the process a base layer of $TiO_x$ mixed with at least one metal oxide can be deposited. Suitable metal oxides are for example MgO, ZnO, $ZrO_2$, $In_2O_3$, $Sb_2O_3$, $Al_2O_3$ and/or $SiO_2$, where the proportion of $TiO_x$ after mixing remains above 50 w. %. Furthermore, the top layer of $TiO_2$ can also be doped with $Fe_2O_3$, $WO_3$, $MnO_2$, NiO, BaO and/or CaO, where the proportion of $TiO_2$ after doping remains above 93 w. %. If metal oxides of both groups are added to the base layer of $TiO_x$, the total proportion of all metal oxides must remain below 50 w. %, the proportion of the added doping metal oxides of the second group must remain below 7 w. %.

The deposition according to the invention of a base layer of $TiO_x$ ($0.7 \leq x<2$) and a top layer of $TiO_2$ brings numerous advantages listed inexhaustively below:

- The process can be performed at a substrate temperature of $\leq 200°$ C. which is important in particular for polymer substrates. Also a low temperature process may be indicated for metals, ceramics and composites and combinations thereof.
- Deposition of an electrically conductive $TiO_x$ layer onto electrically non-conductive substrates reduces the electrostatic charge and thus supports the hygiene protection synergetically.
- The coating of an organic chemical substrate (polymer, natural substance) with a base layer of $TiO_x$ ($x<1.9$) and/or $TiO_x(OH)_y$ with a significant hydroxide proportion is usually non-problematical (no degradation).
- A thin coating has the advantage that the mechanical and processing properties of the substrate are retained. This is particularly important for the processing of fibres and films which must subsequently withstand further treatment processes.
- With a plasma-activated process, prespecified layer properties such as porosity, crystallinity, density, electrical conductivity, refractive index and polarity can be produced in a targeted manner. In particular, the combination of dense with porous nano-structured multilayers which can have different electrical conductivity and refractive indices, can achieve a synergetic functionality of the titanium oxide layer. For example, the topography of the substrate can be changed or supplemented with suitable layer topography such that this synergetically reinforces the cleaning and hygiene functions.

The synergetic multi-functionality of the titanium oxide layers can be adapted to the application concerned. The plasma-activated low temperature process preferred for production of the layer systems e.g. by magnetron sputtering, spark discharge and plasma MOCVD, are particularly suitable for varying the stoichiometry and layer structure by means of simple process management, and for stabilising the modification anatase by means of the doping of a titanium oxide layer with at least one metal oxide, for example $Fe_2O_3$, which is easy to perform process technologically. Low temperature processes are therefore also interesting for materials which are not sensitive to heat, such as glass.

Thanks to a titanium oxide layer according to the invention with a base layer of $TiO_x$ and a top layer of $TiO_2$ which has a thickness of >3 nm, in particular >10 nm, hygiene protection, biocompatibility, anti-fogging effect and hence active flame protection can be achieved on practically all substrates. Thanks to the underlying $TiO_x$ base layer biocompatibility, degradation protection of the substrate, passive flame protection, anti-static effect, migration and diffusion barrier protection are also guaranteed.

A photocatalytically active hygiene protection layer of $TiO_2$ has the ability, in damp atmospheres and under daylight or UV radiation, to decompose various organic compounds on the surface (compounds containing carbon and/or nitrogen, such as oil, bacteria). Thanks to the reduction in contact angle between water and the $TiO_2$ surface of the top layer, the result is also an anti-fogging effect and a supported removal of dust particles. This hygiene protection, also known as a self-cleaning effect, synergetically reinforces the passive flame protection of a flammable substrate. In this case there is active and reactive flame protection.

In passive flame protection the direct contact of the atmosphere with highly flammable substrate is reduced by the coating according to the invention with a thermally stable titanium oxide which on fire forms a crust of heated titanium oxide. The speed of flame propagation is reduced by the crust and the development of gases escaping from the substrate is reduced (diffusion barrier), which finally can lead to extinction of the flame by passive protection.

Figure 2:
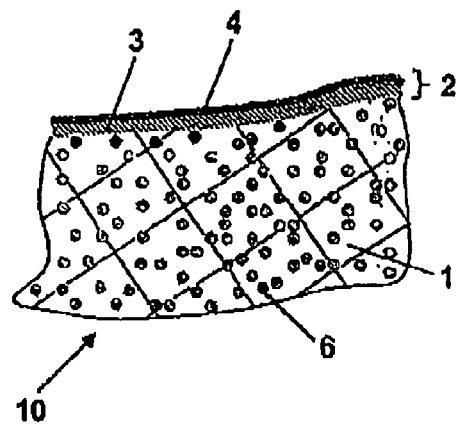
Figure 3:
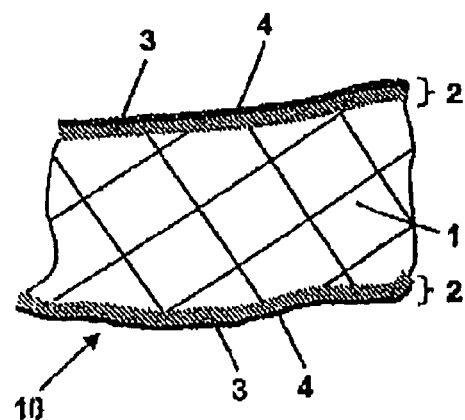
Figure 5:
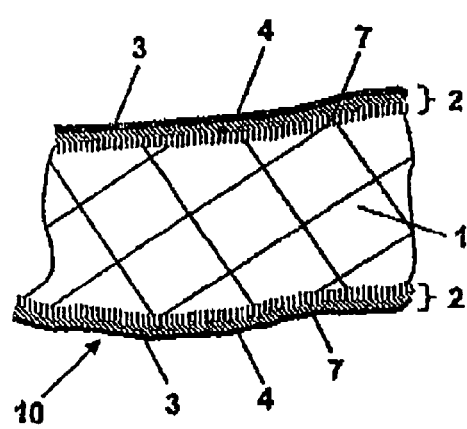
Figure 4:
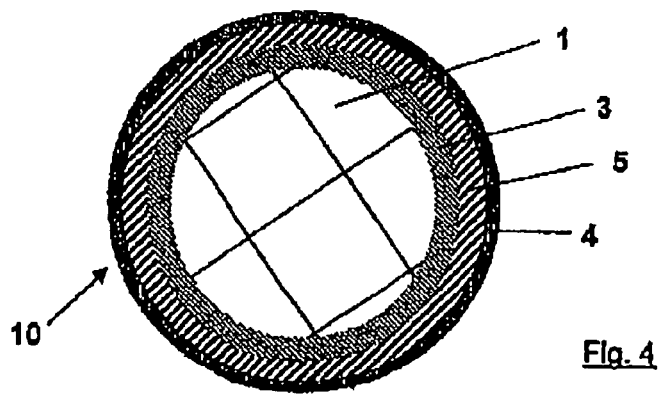

The invention is explained in more detail with reference to embodiment examples shown in the drawing which also the subject of dependent claims. The mostly partial cross sections depict diagrammatically:

FIG. 1 a film-like composite material with a titanium oxide layer deposited on one side, FIG. 2 a variant according to FIG. 1 with a two part titanium oxide layer, FIG. 3 a variant of FIG. 2 with a titanium oxide layer deposited on both sides, FIG. 4 a fibre with a three part titanium oxide layer, and FIG. 5 a variant according to FIG. 2 with an additional protective layer.

FIG. 1 shows a composite material 10 with a substrate 1 and applied on one side a titanium oxide layer 2 without further specification. FIG. 1 corresponds to the usual prior art, a titanium layer 2 is applied to a substrate 1 where it fulfils a protective or other function. FIG. 1 however shows also a special case of the present invention. A thin $TiO_x$ layer has been applied which is post-oxidized into $TiO_2$. Because of the extremely thin layer, the $TiO_x$ layer has been oxidized over the entire thickness into $TiO_2$. The substrate 1 which is shown merely partially can e.g. be a film, fabric, membrane, plate, fibre, tube, cable or container part and comprise a conventional material.

In FIG. 2 the titanium oxide layer 2 is divided into a base layer 3 of $TiO_x$ where the oxygen content is $0.7 \leq x < 2$, and a top layer 4 of $TiO_2$. Distributed finely dispersed in the substrate 1 are submicron particles 6 of a metal oxide/metal hydroxide. The top layer 4 of $TiO_2$ is mainly present in the tetragonal crystal structure anatase.

The transition from the base layer 3 to the top layer 4 is shown sharply. If the base layer 3 is partly converted into a top layer 4 by means of post-oxidization, the transition is flowing.

FIG. 3 shows a composite material 10 with titanium oxide layer 2 applied to both sides. The structure of this titanium oxide layer 2 corresponds to that in FIG. 2.

In FIG. 4 the substrate 1 is a textile fibre and deposited directly on the base layer 3 is an electrically conductive intermediate layer 5 which surrounds as a cylinder casing the base layer 3 which is deposited directly on the fibre. This electrically conductive intermediate layer 5 comprises $TiO_x$ and has an oxygen content of $0.7 < x < 1.5$. Above the intermediate layer lies the top layer 4 which is also formed as a cylinder casing.

Certain plastic substrates are decomposed at least superficially by titanium oxide layers. In the embodiment according to FIG. 5 therefore a protective layer 7 is deposited directly on the substrate 1, where this protective layer 7 has a thickness also lying in the nanometer range. This protective layer 7 is also applied on both sides consists of at least one metal oxide, preferably of the group ZnO, MgO, $ZrO_2$, $In_2O_3$, $Sb_2O_3$, $Al_2O_3$ and/or $SiO_2$, or a polar adhesion layer, for example, a polar plasma layer which also ensures good adhesion to the substrate 1, Table 1

The coating techniques and process parameters are adapted to the requirements for the product to be produced or substrate to be coated. Table 1 shows the production of selected functional titanium oxide layers and their protective and/or function effect. In the base layer 3 a relatively high content of hydrogen was analysed with ERDA (Elastic Recoil Detection Analysis), which is bonded in the layer in the form of hydroxide ions and depends on the process parameters and substrate temperature.

Composite materials which are coated on both sides were each given the same coating. During the coating process the substrate temperature is <200° C. The anti-fogging effect is observed at a surface tension of >50 mN/m and a correspondingly smooth surface. The surface tension also depends on the process parameters in production of the layer.

The thermal capacity of the fabric-like substrate which is coated increases virtually linear with the increasing layer thickness. According to the coated surface, the effect is visibly greater for PET film than for PET fabric. The thicker fabric mixture comprising 36% polyester and 64% viscose C shows a far less pronounced effect than the fine PET fabric. It is clear from this data that the layer thickness must be adapted to the substrate concerned (material, texture, thickness) in order to achieve the desired effect.

The average flame propagation speed for general textiles should be less than 90 mm/s, for textile curtains less than 60 mm/s. Even with a 12 nm thin ceramic coating, for a fine PET fabric the flame propagation speed lies far below the limit value of 60 mm/s and at a layer thickness of 180 nm achieves a value of 31 mm/s. For the viscose/polyester mixture there is a significant reduction from 142 to 115 mm/s with a 95 nm thick $TiO_x/TiO_2$ layer.

TABLE 1

Examples of processes for production of selected ceramic metal oxide layers with multiple protective or function effects

| Layer Substrate | Process | Power [W] | Process pressure [μbar] | $P_{(O2)}/P_{(tot)}$ [%] | Thickness [nm] | Stoichiometry, structure[a] | Spec. thermal capacity Δ [J/gK] | LOI[b] [vol %] | Flame propagation speed[c] [mm/s] | BIF[d] | Transmission[e] [%] | Comments Material layer |
|---|---|---|---|---|---|---|---|---|---|---|---|---|
| A | reactive DC sputtering of TI(s) + $O_2$ | 2000 | 10 | 15 | 12/180 | $TiO_{1.9}$ | | | | | | Base layer 3 |
| | plasma post-oxidization | 800 | 200 | 90 | | $TiO_2$ | | | | | | Top layer 4 |
| PET fabric | 85 μm thick substrate | | | | 2 × 12 | | 1.6 | 5 | 6.0  55 | — | | Material |
| PET fabric | 85 μm thick substrate | | | | 2 × 180 | | 4.7 | 10 | 3.0  31 | — | | layer |
| B | reactive DC sputtering of TI(s) + $O_2$ | 800 | 7 | 10 | 360 | $TiO_{1.7}(OH)_{0.4}$ | | | | | | Base layer 3 |
| | reactive DC sputtering of TI(s) + $O_2$ | 1000 | 12 | 7.5 | 75 | $TiO_{0.9}$ | | | | | | Intermediate layer 5 |
| | reactive DC sputtering of TI(s) + $O_2$ | 1000 | 20 | 25 | 20 | $TiO_2$ | | | | | 25 | Top layer 4 |
| C | reactive RF sputtering of TI(s) + $O_2$ | 600 | 15 | 7.5 | 70 | $TiO_{21.9}$ | | | | | | Base layer 3 |
| | reactive RF sputtering of TI(s) + $O_2$ | 1000 | 23 | 70 | 25 | $TiO_2$ | | | | | | Top layer 4 |
| PET fabric | 85 μm thick substrate | | | | 2 × 95 | | 2.4 | 8 | 3.7  44 | | | Material |
| PET film | 12 μm thick substrate | | | | 2 × 95 | | 4.0 | 15 | —   — | 93 | 19 | layer |
| Viscose/PET | 64%/36% mixture | | | | 2 × 95 | | 1.4 | — | —  115 | | | |
| D | RF sputtering of MgO | 1500 | 15 | 0 | 80 | MgO | | | | | | Base layer 3 |
| | RF sputtering of TiO(s) | 700 | 20 | 0 | 15 | $TiO_{1.0}$ | | | | | | Intermediate layer 5 |
| | RF sputtering of $TiO_2$(s) | 1000 | 20 | 0 | 5 | $TiO_2$ | | | | | | Top layer 4 |
| PET fabric | 85 μm thick substrate | | | | 2 × 100 | | 3.3 | — | 20 | | | Material |
| PET film | 12 μm thick substrate | | | | 1 × 100 | | | | | | 57 | layer |
| E | Plasma MO-CVD with $Ti(O-CH(CH_3)_2)_4$ | 1900 | 1000 | 30 | 40 | $TiO_{1.9}$ | | | | | | Base layer 3 |
| | Plasma MO-CVD with $Ti(O-CH(CH_3)_2)_4$ and $Fe(C_5H_7)_2)_3$ | 2700 | 2000 | 60 | 350 | $TiO_2$ | | | | | | Top layer 4 |
| PET film | 12 μm thick substrate | | | | 1 × 390 | | | | | 120 | 42 | Material layer |

[a]The stoichiometry of the layers and the layer surface was determined with RBS (Rutherford Backscattering Spectroscopy), ERDA (Elastic Recoil Detection Analysis) and XPS (X-ray Photoelectron Spectroscopy). The crystal structure of the layers was analysed qualitatively with TEM (Transmission Electron Microscopy) and XRD (X-ray). In the mixtures of amorphous and various crystalline phases (anatase, rutile and suboxides $TiO_x$ ($0.5 \leq x < 2$) the corresponding phases could be identified in each case.
[b]The LOI (Limiting Oxygen Index) ISO 4589-2/ASTM D2863-77 describes the increase in limiting oxygen content in a gas mixture in the vol. % for a flame to combust the coated material.
[c]Burning speed, which was performed according to test 4589-2/ASTM D2863-77 (left-hand column) and average flame propagation speed, which was performed according to burning test BS EN ISO 6941 (right-hand column).
[d]The BIF (Barrier Improvement Factor) shows the factor by which the oxygen permeability (measured in [ccm/$m^2 \cdot d \cdot bar$]) according to ASTM D3985-95 at 0% r.h. and 23° C.) diminishes due to coating of 12 μm thick PET film in comparison with the uncoated PET film (124 cm/$m^2 \cdot d \cdot bar$).
[e]A coated pre-radiated glass material is immersed in a 0.05 mmol watery methylene blue solution and irradiated with a UV lamp (2 mW/$cm^2$). The transmission change in solution is measured after 96 hours in a spectrophotometer at a wavelength of 650 nm according to the Sinku-Riko PCC-1.

The electrical conductivity and electrical resistance of the intermediate layer 5 concerned is given in example 3. The electric resistance of a 100 nm thick $TiO_2$ layer is more than $2 \cdot 10^5$ Ωcm.

EXAMPLES

Some examples are described below for the production of multifunctional titanium oxide layers. In each case the layer properties and the layer structure are adapted to the product requirements concerned.

Example 1

Reactive Magnetron Sputtering with Subsequent Post-Oxidization

The deposition of a titanium oxide layer 2 on any substrate 1 with a reactive sputtering process (DC=(pulsed) direct current; RF=radio frequency) of titanium with a mixture of process gases of argon and oxygen. Then by a change in plasma conditions (variant 1*a*) and/or with post-oxidization (variant 1*b*) of the composite material a $TiO_2$ top layer 4 containing anatase is formed.

Coating Process:

| | |
|---|---|
| Target: | Titanium metal (99.98%) |
| Power: | 1–7 W/$cm^2$ DC/RF |
| Process pressure: | 10 μbar |
| Partial pressure p($O_2$)/p(tot): | 10% DC/RF |

Variant 1*a*: $TiO_2$ Layer at the End of the Process

In the last phase of the reactive sputtering process, the process pressure is increased to 20 μbar and in the case of the DC sputtering process the oxygen partial raised to 30%, in the case of RF sputtering process the oxygen partial pressure is raised to 60%. The increase in process pressure and oxygen partial pressure acts favourably on the layer properties of the top layer which are characterised by a lower density, a higher porosity and hence larger surface.

Variant 1b: Post-Oxidization of $TiO_x$ to $TiO_2$

In this case the titanium oxide layer is oxidized in an oxidizing atmosphere with a PE-CVD at low pressure to atmospheric pressure. The penetration depth of the post-oxidization depends on the density of the $TiO_x$ layer and the process conditions.

| | |
|---|---|
| Power (pulsed/continuous): | 50–3000 W radio frequency (MHz), hyperfrequency (GHz) or low frequency (kHz) |
| Process pressure: | 0.1 mbar–1 bar |
| Partial pressure p(O$_2$)/p(tot): | 50–100% |

Example 2

Adhesion-Promoting Pretreatment and Plasma-activated MOCVD Process

Plasma activation of a substrate take place (1) to increase the adhesion of the coating.

Pretreatment:

| | |
|---|---|
| Power (pulsed/continuous): | 200–1500 W hyperfrequency (2.45 GHz) |
| Process pressure: | 20 μbar–1 bar |
| Partial pressure p(O$_2$/N$_2$O)/p(tot): | 20–80% |

Base Layer 4 Comprising $TiO_x$ or $TiO_x$ Mixed with $SiO_x$:

Then introduced into the reaction chamber is a titanium-containing monomer gas for example titanium tetrakis-isopropoxide (TTIP) (Ti(O—CH(CH$_3$)$_2$)$_4$) together with oxygen and one or more inert gases (Ar, He), and a $TiO_x$ layer 4 deposited. In addition hexamethyidisiloxane (HMDSO) can be introduced into the plasma process so as to give a ratio of the two metal oxides in the base layer of 2:1.

| | |
|---|---|
| Power (pulsed/continuous): | 600–3500 W hyperfrequency (2.45 GHz) |
| Process pressure: | 10 μbar–0.1 bar |
| Process gases: | Ar/He as carrier gas through (Ti(O—CH(CH$_3$)$_2$)$_4$) at 50° C., Ar/he and O$_2$. |

Top Layer 4 Comprising $TiO_2$ or $TiO_2$ Doped with $Fe_2O_3$:

Then on the base layer 3, after the titanium-containing process gases, as a carrier gas a small quantity of an iron-containing monomer gas is introduced into the reaction chamber (e.g. iron-acetylacetonate complex Fe(C$_5$H$_7$O$_2$)$_3$, with oxygen and one or more inert gases (Ar, He etc), to deposit an anatase-containing $TiO_2$ top layer 4 doped with 0.1-9 at % Fe$_2$O$_3$. At the same time by varying the process parameters, the layer structure can be modified.

Using numerous energy-rich plasma-activated discharges from low frequency up to hyperfrequency range and combinations thereof it is possible to produce the composite materials described. Examples are (Remote) AP-PECVD (atmospheric pressure plasma-enhanced chemical vapour deposition), APNEP (atmospheric pressure non-equilibrium plasma), plasma jet, plasma broad beam burner, microwave discharge, pulsing surface discharge, DBD (dielectric barrier discharge), APGD (atmospheric pressure glow discharge).

Example 3

Electrically Conductive $TiO_x$ Intermediate Layer 5

An electrically conductive intermediate layer 5 is produced which is more conductive than the base layer 3 and/or the additional base layer 7. The $TiO_x$ layer ($0.7 \leq x < 1.5$) is deposited with any substrate 1 fitted with a base layer 3, in that in a reactive sputtering process less oxygen gas is supplied to the process than in the base layer 3 and the process pressure is adapted. It is also possible to deposit the $TiO_x$ layer non-reactively in a sputtering process using a corresponding target (TiO, Ti$_2$O$_3$, Ti$_3$O$_2$ etc.).

Reactive DC Sputtering Process to Obtain a $TiO_{1.0}$ Layer with an Electrical Resistance of $1.2 \cdot 10^{-2}$ Ωcm or 50 Ωcm:

| | |
|---|---|
| Target: | Titanium metal (99.98%) |
| Power: | 3 W/cm$^2$ DC |
| Process pressure: | 20 μbar or 7 μbar |
| Partial pressure p(O$_2$)/p(tot): | 5% or 7.5% |

The invention claimed is:

1. Composite material (10) comprising:
   a substrate (1) that is at least one of flammable and heat sensitive; and
   a flame protection coating (2) on the substrate;
   the flame protection coating comprising:
   a base layer (3) of $TiO_x$ applied on the substrate (1) where $1.5 \leq x \leq 1.9$;
   a top layer (4) of at least one of amorphous and crystalline $TiO_2$ formed on the $TiO_x$ base layer (3); and
   wherein a total thickness of the flame protection coating (2) is in the range of 10-300 nm, wherein the $TiO_2$ top layer (4) has a thickness in the range of 10-50% of the total thickness of the flame protection coating, and wherein between the base layer (3) and the top layer (4) of the titanium oxide layer (2) is deposited an electrically conductive intermediate layer (5) which comprises $TiO_x$ with an oxygen content of $0.7 \leq x \leq 1.5$.

2. Composite material (10) according to claim 1, characterized in that between the substrate (1) and the base layer (3) of the titanium oxide layer (2) is deposited a protective layer (7) of at least one of the metal oxides of the group consisting of ZnO, MgO, ZrO$_2$, In$_2$O$_3$, Sb$_2$O$_3$, Al$_2$O$_3$ and SiO$_2$.

3. Composite material (10) according to claim 1, characterized in that the base layer (3) of $TiO_x$ is mixed with at least one additive metal oxide from the group consisting of MgO, ZnO, ZrO$_2$, In$_2$O$_3$, Sb$_2$O$_3$, Al$_2$O$_3$ and SiO$_2$, where the total proportion of all additive metal oxides remains below 50 w. %.

4. Composite material (10) according to claim 1, characterized in that at least the nine top atomic layers of the top layer (4) of the titanium oxide layer (2) mainly comprise the $TiO_2$ modification anatase.

5. Composite material (10) according to claim 1, wherein the substrate is a plastic substrate (1), characterized in that mixed with the plastic substrate (1), are finely dispersed, sub-micron filler particles (6) of a metal oxide or a metal hydroxide which dehydrates under heat.

6. Composite material (10) according to claim 1, wherein the top layer (4) is deposited of $TiO_2$ doped with at least one metal oxide from the group consisting of $Fe_2O_3$, $WO_3$, $MnO_2$, NiO, BaO and CaO, where in total less than 7 w. % doping is added.

7. Composite material (10) according to claim 1, wherein, between the substrate (1) and the base layer (3) of the titanium oxide layer (2) is deposited a protective layer (7) of a polar adhesion.

8. Composite material (10) according to claim 1, wherein the base layer (3) of $TiO_x$ is doped with at least one metal oxide of the group consisting of $Fe_2O_3$, $WO_3$, $MnO_2$, NiO, BaO and CaO, where the total proportion of all metal oxides remains below 7 w. %.

9. Composite material (10) according to claim 1, wherein the substrate (1) comprises at least one of a polymer material and a textile material.

10. Composite material (10) according to claim 9, wherein the substrate (1) has opposite sides and includes said coating on both of the opposite sides.

11. Composite material (10) comprising:
a substrate (1) that is at least one of flammable and heat sensitive; and
a flame protection coating (2) on the substrate;
the flame protection coating comprising:
a base layer (3) of $TiO_x(OH)_y$ applied on the substrate (1), where $1.5 \leq x \leq 1.9$ and a $0.2 \leq y < 0.7$;
a top layer (4) of at least one of amorphous and crystalline $TiO_2$ formed on the base layer (3); and
wherein a total thickness of the flame protection coating (2) is in the range of 10-300 nm and wherein the $TiO_2$ top layer (4) has a thickness in the range of 10-50% of the total thickness of the flame protection coating.

12. Composite material (10) according to claim 11, characterized in that between the substrate (1) and the base layer (3) is deposited a protective layer (7) of at least one of the metal oxides of the group consisting of ZnO, MgO, $ZrO_2$, $In_2O_3$, $Sb_2O_3$ $Al_2O_3$, and $SiO_2$.

13. Composite material (10) according to claim 11, characterized in that the base layer (3) is mixed with at least one metal oxide from the group consisting of MgO, ZnO, $ZrO_2$, $In_2O_3$, $Sb_2O_3$, $Al_2O_3$ and $SiO_2$, where the total proportion of all metal oxides remains below 50 w. %.

14. Composite material (10) according to claim 11, characterized in that between the base layer (3) and the top layer (4) is deposited an electrically conductive intermediate layer (5) which comprises $TiO_x$ with an oxygen content of $0.7 \leq x \leq 1.5$.

15. Composite material (10) according to claim 11, characterized in that at least the nine top atomic layers of the top layer (4) mainly comprise the $TiO_2$ modification anatase.

16. Composite material (10) according to claim 11, wherein the substrate is a plastic substrate (1) mixed with are finely dispersed, sub-micron filler particles (6) of a metal oxide or a metal hydroxide which dehydrates under heat.

17. Composite material (10) according to claim 11, wherein the top layer (4) is deposited of $TiO_2$ doped with at least one metal oxide from the group consisting of $Fe_2O_3$, $WO_3$, $MnO_2$, NiO, BaO and CaO, where in total less than 7 w. % doping is added.

18. Composite material (10) according to claim 11, wherein, between the substrate (1) and the base layer (3) of the titanium oxide layer (2) is deposited a protective layer (7) of a polar adhesion.

19. Composite material (10) according to claim 11, wherein the base layer (3) is doped with at least one metal oxide of the group consisting of $Fe_2O_3$, $WO_3$, $MnO_2$, NiO, BaO and CaO, where the total proportion of all metal oxides remains below 7 w. %.

20. Composite material (10) according to claim 11, wherein the substrate (1) comprises at least one of a polymer material and a textile material.

21. Composite material (10) according to claim 20, wherein the substrate (1) has opposite sides and includes said coating on both of the opposite sides.

* * * * *